United States Patent [19]
Besser et al.

[11] Patent Number: 5,789,315
[45] Date of Patent: Aug. 4, 1998

[54] ELIMINATING METAL EXTRUSIONS BY CONTROLLING THE LINER DEPOSITION TEMPERATURE

[75] Inventors: Paul R. Besser; Robin W. Cheung, both of Cupertino, Calif.

[73] Assignee: Advanced Micro Devices, Inc., Sunnyvale, Calif.

[21] Appl. No.: 682,231

[22] Filed: Jul. 17, 1996

[51] Int. Cl.$^6$ ............................................. H01L 21/441
[52] U.S. Cl. .................... 438/624; 438/637; 438/660; 257/760
[58] Field of Search ........................ 437/195, 194, 437/288, 235, 238, 247, 248; 438/624, 637, 660, 787; 257/760, 790, 765

[56] References Cited

U.S. PATENT DOCUMENTS

| | | |
|---|---|---|
| 5,003,062 | 3/1991 | Yen ............................... 437/231 |
| 5,405,805 | 4/1995 | Homma . |
| 5,453,402 | 9/1995 | Cheung et al. ..................... 437/195 |
| 5,457,073 | 10/1995 | Ouellet ............................ 437/231 |

OTHER PUBLICATIONS

Bruce L. Draper, et al. "Stress and Stress Relaxation in Integrated Circuit Metals and Dielectrics" J. Vac. Sci. Technol. B 9(4) pp. 1956–1961, Jul./Aug. 1991.

Arthur T. Learn, "Suppression of Aluminum Hillock Growth ..." J. Vac. Sci. Tech. B 4(3) May/Jun. 1986 pp. 774–776.

H. Shibata et al, "Via hole–related simultaneous stress–induced Extrusion and Void Formation in Al interconnects," 1993 IEEE IRPS Proc., pp. 340–344 (1993).

*Primary Examiner*—Caridad Everhart
*Attorney, Agent, or Firm*—Gerald M. Fisher

[57] ABSTRACT

An improved integrated circuit manufacturing process for forming interlevel dielectrics in multilevel metallization structures eliminates extrusions of metal into vias following via etch. The deposition temperature of the conformal dielectric liner is controlled relative to the subsequent degas temperature, thereby lowering thermal compressive stresses in the metal layer.

22 Claims, 6 Drawing Sheets

ELIMINATING METAL EXTRUSIONS BY CONTROLLING THE LINER DEPOSITION TEMPERATURE

FIELD OF THE INVENTION

This invention relates to integrated circuit manufacturing processes for forming multi-level metallization structures, and in particular to formation of interlevel dielectric.

BACKGROUND OF THE INVENTION

As integrated circuits have become increasingly fast, device sizes and geometries have shrunk accordingly, which necessitates the use of multilevel metallization schemes to provide the necessary device and circuit interconnections without limiting packing density.

Multilevel metallization systems are comprised of alternating layers of dielectric and metal materials. Most commonly, the metal layers are comprised mainly of aluminum or aluminum alloys. The metal interconnects in the layer closest to the silicon surface make contact to the underlying silicon devices through contact holes etched in the first interlevel dielectric layer, known as ILD0. The successive metal layers are electrically connected to each other as required by openings known as vias which are etched through the interlevel dielectric layers. Vias are typically filled with a conductor such as aluminum or tungsten. The conducting material filling the via is called a via plug. The via plug may be formed separately from the next metal layer, as by a CVD tungsten via fill process. This process involves use of barrier layers and etchback or chemical-mechanical polishing, and is an involved and expensive process. Vias may also be filled simultaneously with deposition of the next layer of metal, which has been found to be a preferable method for many applications.

Both the metallic interconnects and the interlayer dielectrics have evolved from simple, single-layer structures into complex structures known as stacks which comprise a series of layers. By way of example, aluminum alloy metallization lines are typically sandwiched between conducting underlayers and overlayers. Underlayers such as Ti and Ti/TiN have been shown to increase the electrical performance of the metallic interconnect by improving the grain structure or crystallographic texture of the Al, as well as the grain size. If a void forms in the Al metallization during testing or under operation, this underlayer also serves as a shunt layer and permits continuous current flow. The overlayer may be comprised of multilayers of Ti, Al, and/or TiN. The overlayer serves many functions, including that of providing an antireflective coating (ARC) to enhance lithographic resolution. In addition, it may serve as a barrier/adhesion/nucleation film to protect the underlying aluminum from damaging interactions with chemicals or other materials utilized in subsequent processing steps.

Another function of the overlayer is to reduce the formation of hillocks. Hillocks are protrusions which form in response to a state of compressive stress in a metal film, and consequently protrude from the film's surface. The compressive stress generally arises from the difference in the thermal expansion coefficient between the metal and the adjacent materials. Hillock growth takes place via a vacancy-diffusion mechanism. Vacancy concentration increases with stress and temperature, and the rate of diffusion increases rapidly with increasing temperature. Aluminum in particular is susceptible to hillock formation due to its low melting point and the consequent high rate of vacancy diffusion in aluminum films. Therefore the ARC overlayer serves an additional important function in aluminum metallization systems. The overlayer is rigid and can withstand the stresses induced in the aluminum film, and thereby inhibits hillock formation.

After deposition of the metal stack, the metal lines are patterned and etched. The tops of the metal lines are covered by the overlayer, but the metal sidewalls are directly exposed after the etch step is performed. Following the patterning and etching of the metal, the interlayer dielectric (ILD) is deposited thereon. The ILD described herein refers to dielectric deposited after the first or subsequent level of metal is deposited and patterned, in contrast to ILD0. Different processing issues apply to ILD0 than apply to the subsequent ILD layers. In addition to electrically isolating the successive metal levels from one another, the ILD serves as an electrical insulator between adjacent interconnect lines on the same level.

As geometries have shrunk, the spaces between metal lines have decreased. This presents processing challenges in filling the gap between metal lines without resultant voids in the dielectric. Additionally, as more levels of metal are added, the need for partial or complete planarization of the ILD increases, to avoid problems with step coverage of subsequent metal lines as they cross over the high and steep steps. Submicron optical lithography resolution also degrades if surfaces are not substantially planar. As a result of these and other issues, the ILD has evolved into a complex structure, similarly to the metallic interconnect lines. One such structure is described by Sultan et al in U.S. Pat. No. 5,382,547 (1995).

A typical ILD will include a first liner, or passivation layer, 18, which is uniformly deposited over the exposed metal lines and provides conformal coverage of the patterned lines as shown in FIG. 2a. The liner 18 serves as a rigid encapsulation layer over the metal line. This prevents the formation of stress-induced hillock-like extrusions from the exposed metal sidewalls, which do not have the constraining overlayer covering as does the top surface. The conformal liner is generally deposited at elevated temperatures of approximately 350 degrees Centigrade, by chemical vapor deposition (CVD) or Plasma Enhanced Chemical Vapor Deposition (PECVD) methods. The material may be a silane oxide or TEOS (deposited by the decomposition of tetraethyl orthosilicate) silicon-rich oxynitride.

Following deposition of the conformal liner layer, the gap between metal lines may be filled with a dielectric 20 such as spin-on-glass (SOG), followed by an etch-back, resulting in a profile as shown in FIG. 2b. Additional layers of dielectric 22 may be deposited thereupon, to provide the desired thickness of dielectric separating the underlying metal from subsequently deposited metal layers, and to partially planarize the surface. A diagram of an illustrative final dielectric profile is shown in FIG. 2c.

Via holes are then etched through the ILD to provide the necessary interconnections between the underlying metal and the upper layer of metal. The via etch may be comprised of a wet etch, a dry etch, or a combination of the two. A requirement of the via etch is its high selectivity of dielectric etch rate over ARC overlayer etch rate, the ARC layer thereby functioning as a via etch stop. Ideally, after via etch, the protective ARC layer would remain substantially continuous and unetched. In reality, however, the via must be overetched in order to ensure complete removal of the dielectric over the metal, and frequently the via etch rate selectivity is not sufficiently high to avoid thinning of, or discontinuities in, the ARC layer. As a result, the protective encapsulation function of the ARC layer becomes less effective. Subsequent high temperature anneal steps have been found to induce metal extrusions 28, FIG. 3, into the via holes. In particular, if the aforementioned process for simultaneously filling the via and depositing the next level of metal is utilized, stress-induced, hillock-like extrusions of metal into the via regions can occur prior to and during deposition of the next metal layer. They have also been observed during the aforementioned CVD tungsten via fill process. Such extrusions and the associated problems have been reported by Shibata et al, in 1993 IEEE IRPS Proc. pg. 340 (1993). In this paper, the authors report occurrence of simultaneous aluminum extrusion into the via hole and void formation in the aluminum interconnects. The voids drastically degrade the reliability of aluminum lines with vias. The authors' suggested solution to this problem is to attempt to eliminate anneal steps subsequent to via etching. This would severely limit the available processing options for multilevel metallization systems.

SUMMARY OF THE INVENTION

We have provided an improved method of forming the ILD prior to via fill/metal deposition which substantially eliminates the problem of metal extrusions into the via regions. This method involves controlling the liner deposition temperature relative to temperature of the pre-metal deposition outgas step to control the thermal stress in the underlying metal line.

An object of this invention is to provide an improved integrated circuit manufacturing process for forming interlevel dielectrics which eliminates metal extrusions into via regions during via fill/metal deposition.

Another object of this invention is to provide an improved integrated circuit manufacturing process for forming interlevel dielectrics which utilizes existing via etch processes.

Another object of this invention is to provide an improved integrated circuit manufacturing process for forming interlevel dielectrics which controls thermal stress in the underlying metal line.

Another object of this invention is to provide an improved integrated circuit manufacturing process for forming interlevel dielectrics which does not prohibit utilization of subsequent high temperature anneal steps.

Another object of this invention is to provide an improved integrated circuit manufacturing process for forming interlevel dielectrics which comprises depositing the liner at a temperature higher than the subsequent metal outgas temperature.

DETAILED DESCRIPTION OF THE INVENTION

Figure 1:
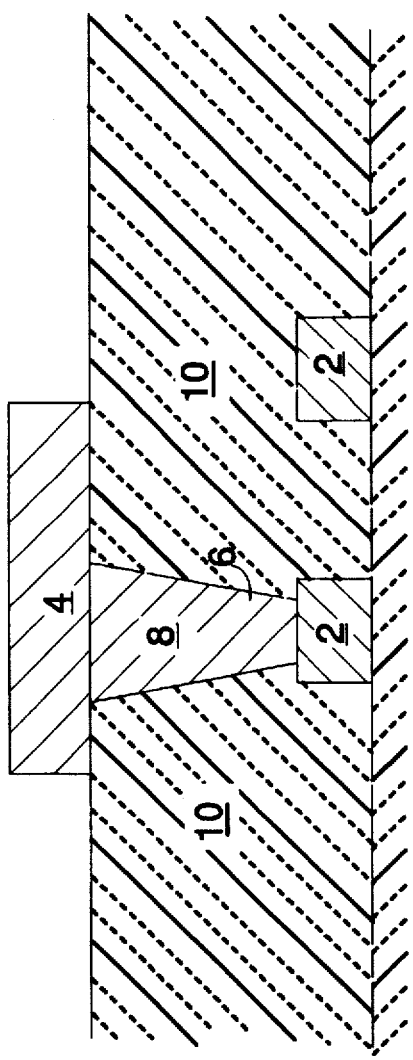
FIG. 1 is a diagram of a via fill/metallization structure.

FIG. 1 shows an idealized diagram of a portion of a multilevel metallization region in an integrated circuit. The integrated circuit has been processed up to the metallization steps, using standard methods which are not a part of this invention. First level metal line 2 is above ILD0, 3, and is connected to second level metal 4 through via 6. Via plug 8 may be formed simultaneously with, or prior to, second level metal 4. Interlevel dielectric (ILD) 10 electrically isolates first level metal 2 from second level metal 4. ILD 10 is substantially planarized before via etch is performed.

Figure 2A:
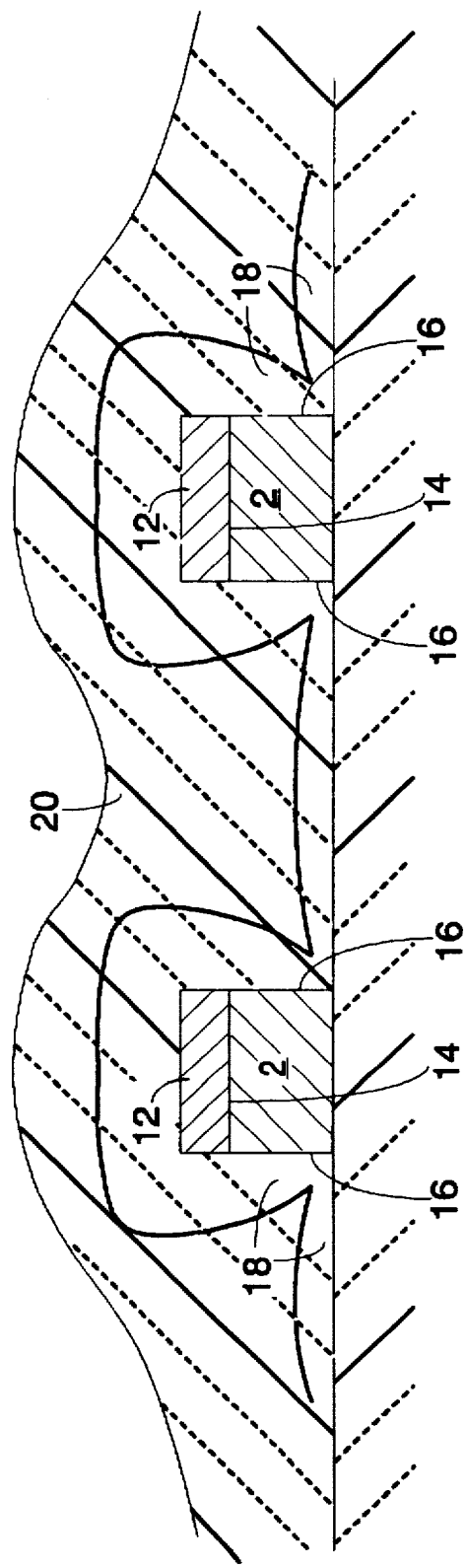
FIG. 2a is a diagram of a metal line with a conformal liner and SOG thereupon.
Figure 2B:
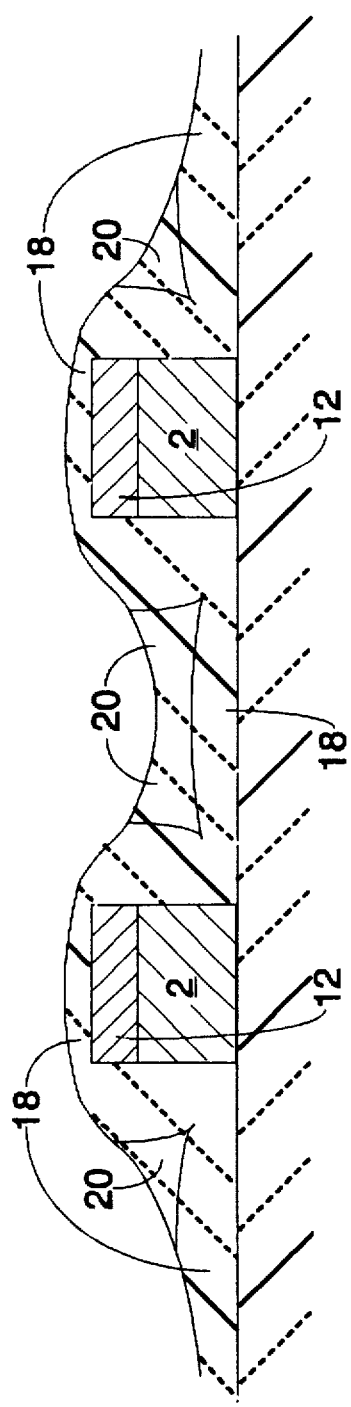
FIG. 2b is a diagram after etchback of a metal line with a conformal liner and SOG thereupon.
Figure 2C:
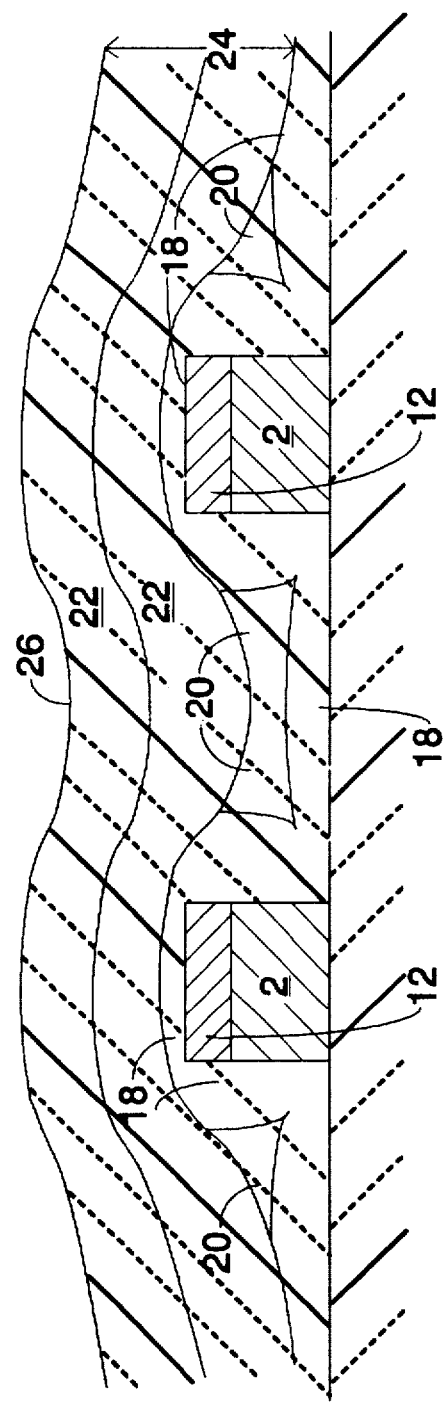
FIG. 2c is a diagram of a metal line with the total ILD thereupon.

FIG. 2a–c shows the realistic formation, known in the prior art, of the interlevel dielectric 10. In FIG. 2a, metal lines 2, which are referred to herein as first level metal by way of example only, have ARC overlayer 12 on top surface 14. Metal sidewalls 16 do not have a protective overlayer thereon. Conformal liner 18 is deposited by CVD or PECVD methods by way of example. The deposition temperature of liner 18 is elevated to approximately 350° C. by way of example. Liner 18 provides rigid encapsulation of sidewalls 16 to prevent metal extrusions therefrom. SOG layer 20 may be used to fill the gap between metal lines 2 as well as to aid in planarizing the ILD.

In FIG. 2b, etchback of liner 18 and SOG 20 yields a smoothed profile to allow for void-free and substantially planar ILD.

In FIG. 2c, additional dielectric layers 22 with combined thickness 24 are deposited to provide electrical isolation between metal lines 2 and upper metal layers (not shown). Top surface 26 of ILD is substantially smooth and at least partially planarized, to prevent step coverage problems and to optimize optical lithography resolution. Chemical Mechanical Polishing (CMP) may be used to complete the planarization of the ILD.

Figure 3:
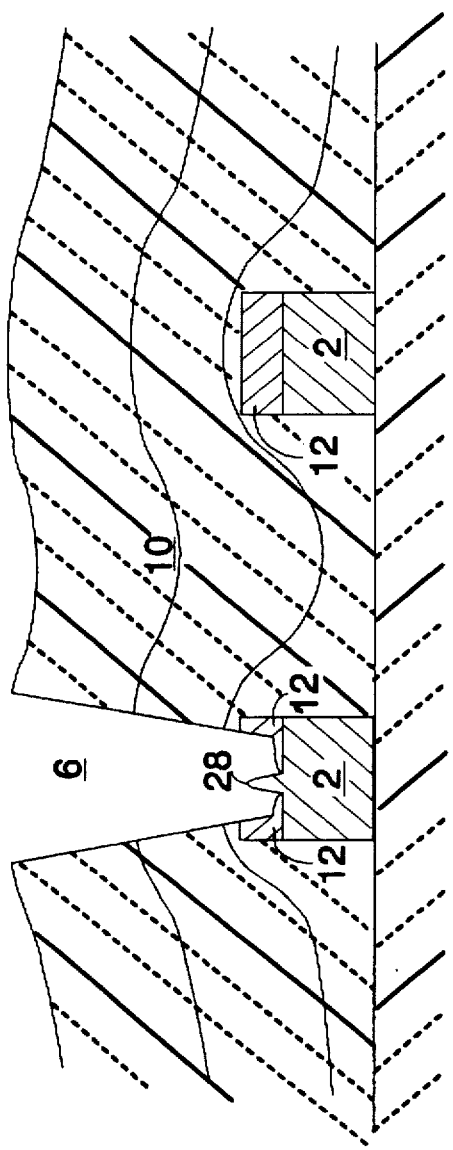
FIG. 3 is a diagram of a metal line with ILD thereupon and a via etched down to the metal line, and showing metal extrusion into the via.

FIG. 3 shows a realistic diagram of a metal line 2 with ILD 10 after a standard via etch. ARC layer 12 is thinner or discontinuous within via 6 due to the via etch. When, by way of example, the structure is placed in the metal deposition system for deposition of the via plug alone, or simultaneous deposition of via plug and next level of metal interconnects, it is raised to an elevated temperature in the range between 350° C. and 400° C. to degas adsorbed impurities and any traces of $H_2O$ before depositing the metal. Thereafter, the metal underlying via 6 can form defect 28 by extruding into the via b. Such extrusions can occur due to any subsequent high temperature anneal step. According to our invention, these metal extrusions into the via can be eliminated without altering the standard via etch or the ARC thickness, by proper control of the deposition temperature of the passivation liner 18 deposited on the underlying metal interconnect.

Figure 4:
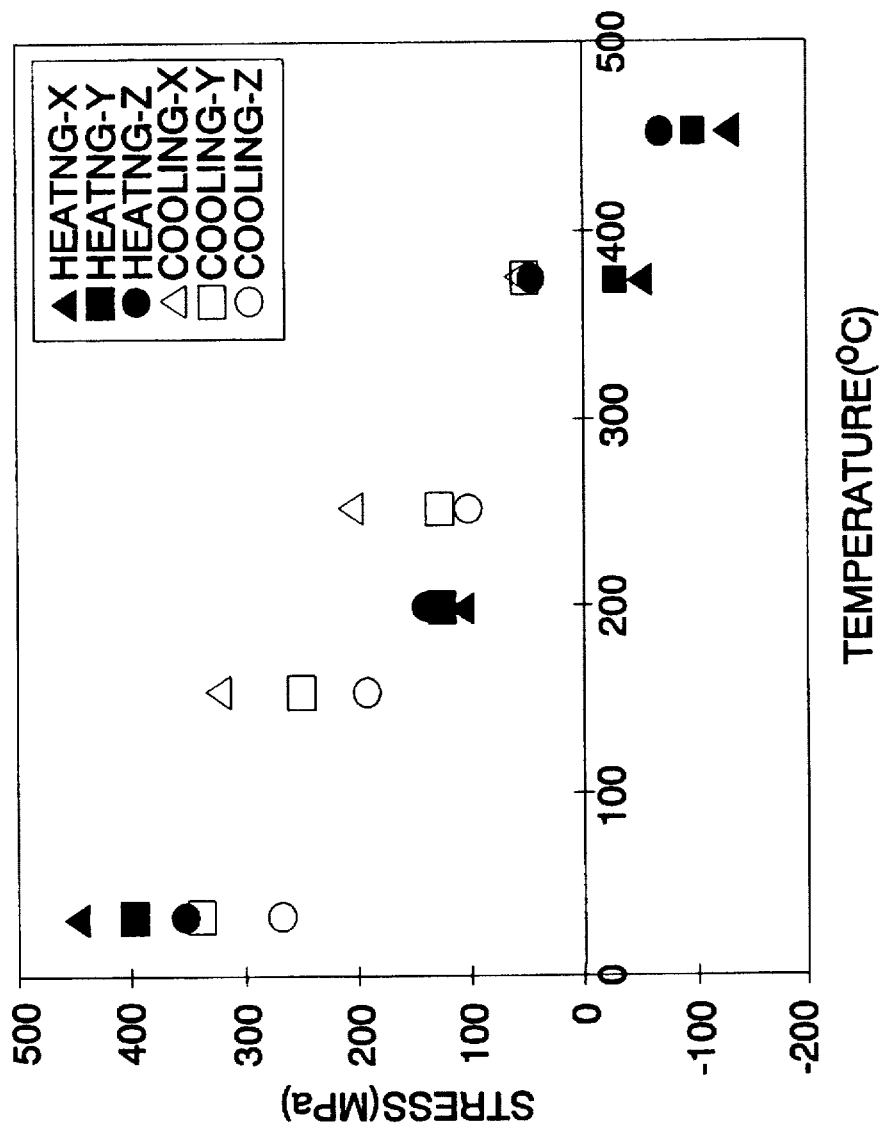
FIG. 4 is a graph of stress versus temperature in a metal line.

It has been discovered that the metal extrusion into the via, similarly to hillock formation, occurs due to thermally-induced compressive stress in the metal line, which causes the metal to extrude into the via to relieve this stress. In the case of a metal line passivated with a rigid conformal oxide liner layer, the stress in the metal line arises from the difference in thermal expansion coefficients between the metal and the surroundings, i.e., the silicon surface and the encapsulant liner. FIG. 4 shows the stress as a function of temperature for Al-0.5%Cu lines upon which the passivation liner was deposited at 380° C. FIG. 4 is a summary of data published by Besser et al in J. Mater. Res. Vol. 9, No. 1, pp 13–24, January 1994. Stress is calculated from the strain state of the metal line, which is measured directly from the interplanar spacing along the length width and height of the line. Grazing incidence x-ray diffraction techniques were used to measure the interplanar spacing of planes with their normal in the sample surface, and conventional x-ray diffraction techniques were used to measure the spacing of planes with their normal parallel to the sample surface normal.

As seen in FIG. 4, the stress level in the metal line is close to zero at the liner deposition temperature of 380° C., and it behaves linearly at temperatures above and below the deposition temperature. Negative stress values, occurring at temperatures above the liner deposition temperature, indicate that the metal line is under compression. As a result, when a heat cycle subsequent to liner deposition raises the temperature above the liner deposition temperature, compression can cause extrusions to occur. The aforementioned degassing heat cycle is one cause of this situation.

According to our preferred method, the liner 18 is deposited at a temperature which is higher than or equal to the temperature of the pre-metal deposition degas step. By way of example, for a typical degas temperature of 350° C., the liner deposition temperature employed is greater than or equal to 350° C. In the preferred embodiment of this invention, a deposition temperature of approximately 400° C. is employed. Alternatively, if the liner deposition temperature were to remain fixed at 350° C., the metal degas temperature would need to be lowered to that value or below. Whereas no processing difficulties have been identified due to the aforementioned raising of the liner deposition temperature, the effectiveness of the degassing is compromised at lowered temperatures. The preferred embodiment of this invention therefore comprises raising the liner deposition temperature.

Experiments have been performed wherein a silane-based oxide liner was deposited at 350° C. A metal degas temperature of 400° C. resulted in aluminum extrusions into the via. The degas temperature was lowered to 350° C. and to 300° C. At both of these lowered degas temperatures, aluminum extrusions were not observed. These experiments are illustrative of the effectiveness of controlling extrusions by varying the relative liner deposition temperature compared to degas temperature. However, they are not illustrative of the best mode.

Our inventive method is a simple modification easily implemented into the existing process flow. No changes are necessary in the via etch process, and the ARC thickness does not need to be changed.

While the invention as described utilizes an ARC, a CVD oxide liner and simultaneous via fill metallization with aluminum alloy, it is not limited to these materials and methods. The scope of the invention should be construed in light of the claims.

With this in mind,

We claim:

1. An integrated circuit manufacturing process for forming on a surface of a silicon substrate an interlevel dielectric (ILD) atop a first patterned metal layer, said ILD separating said first metal from a second metal layer to be deposited upon said ILD, comprising the steps of:

providing a silicon substrate having a device therein at said surface, said substrate having a first patterned metal layer thereon comprising metal lines separated by gaps;

depositing a first conformal liner dielectric layer onto said first patterned metal layer at a first deposition temperature, thereby inducing stress in said metal lines of said first patterned metal layer;

depositing a second dielectric layer onto said liner layer at a second temperature lower than said first temperature, to substantially fill said gaps between said metal lines;

etching a via hole through said first and second dielectric layers to contact one of said metal lines;

after said etching step, degassing said wafer at a degassing temperature lower than or equal to said first deposition temperature; and filling said via hole with a conducting material at a third temperature lower than said first deposition temperature, said stress in said metal lines being in a non-compressive stress state at all times.

2. The process of claim 1, wherein said first metal layer comprises aluminum or an aluminum alloy.

3. The process of claim 2, wherein said first conformal liner dielectric is selected from the group consisting of silane oxide, TEOS oxynitride, SiON, SiO$_2$, HDP SiO$_2$, SiOF.

4. The process of claim 3, wherein said patterned metal lines have top surfaces, and wherein said top surfaces have an antireflective coating thereon.

5. The process of claim 4, wherein said antireflective coating comprises 0–1500 Anstroms of TiN or Ti/TiN.

6. The process of claim 1, wherein said via hole filling step comprises:

degassing said substrate at said third temperature for a first period of time;

depositing said conducting material onto said dielectric, said conducting material thereby substantially filling said vias.

7. The process of claim 6, wherein said first metal layer comprises aluminum or an aluminum alloy.

8. The process of claim 7, wherein said first conformal liner dielectric is selected from the group consisting of silane oxide, TEOS oxynitride, SiON, SiO$_2$, HDP SiO$_2$, SiOF.

9. The process of claim 8, wherein said first deposition temperature is in the range between 350 and 450 degrees Centigrade, and said third degassing temperature is in the range between 300 and 425 degrees Centigrade.

10. The process of claim 9, wherein said patterned metal lines have top surfaces, and wherein said top surfaces have an anti-reflective coating thereon.

11. The process of claim 10, wherein said antireflective coating comprises 0–1500 Angstroms of TiN or Ti/TiN.

12. The process of claim 6, wherein said conducting material comprises said second layer of metal.

13. The process of claim 12, wherein said first metal layer comprises aluminum or an aluminum alloy.

14. The process of claim 13, wherein said first conformal liner dielectric is selected from the group consisting of silane oxide, TEOS oxynitride, SiON, SiO$_2$, HDP SiO$_2$, SiOF.

15. The process of claim 14, wherein said first deposition temperature is in the range between 350 and 450 degrees Centigrade, and said third degassing temperature is in the range between 300 and 425 degrees Centigrade.

16. The process of claim 15, wherein said patterned metal lines have top surfaces, and wherein said top surfaces have an anti-reflective coating thereon.

17. The process of claim 16, wherein said antireflective coating comprises 0–1500 Angstroms of TiN or Ti/TiN.

18. A silicon wafer having a multi-level metallization structure thereon made by the process of claim 1.

19. A silicon wafer having the multi-level metallization structure employing the process of claim 6.

20. A silicon wafer having tile multi-level metallization structure employing the process of claim 9.

21. A silicon wafer having the multi-level metallization structure employing the process of claim 12.

22. A silicon wafer having the multi-level metallization structure employing the process of claim 15.

* * * * *